United States Patent [19]

Kwasniewski et al.

[11] Patent Number: 5,677,650
[45] Date of Patent: Oct. 14, 1997

[54] RING OSCILLATOR HAVING A SUBSTANTIALLY SINUSOIDAL SIGNAL

[75] Inventors: Tadeus Kwasniewski; Maamoun Abou-Seido, both of Ottawa; Stephan Iliasevitch, Nepean, all of Canada

[73] Assignee: PMC-Sierra, Inc., Burnaby, Canada

[21] Appl. No.: 574,922

[22] Filed: Dec. 19, 1995

[51] Int. Cl.⁶ .................................................. H03B 5/02
[52] U.S. Cl. ..................... 331/57; 331/105; 331/108 A; 331/177 R
[58] Field of Search ............................ 331/57, 108 A, 331/177 R, 105

[56] References Cited

U.S. PATENT DOCUMENTS 4,855,690  8/1989  Dias ............................................. 331/57
4,988,960  1/1991  Tomisawa ..................................... 331/57
5,357,217  10/1994  Marchesi et al. .......................... 331/57

OTHER PUBLICATIONS

IBM Technical Disclosure Bulletin, vol. 31, No. 2, Jul. 1988, pp. 154-156, "CMOS Ring Oscillator With Controlled Frequency".

*Primary Examiner*—Siegfried H. Grimm
*Attorney, Agent, or Firm*—Edward E. Pascal; Robert A. Wilkes

[57] ABSTRACT

A ring oscillator comprising an odd number of inverters connected in a ring, and apparatus for driving the ring oscillator so that it oscillates at a frequency slightly less than its maximum oscillating frequency such that harmonics of the oscillating frequency are suppressed.

23 Claims, 6 Drawing Sheets

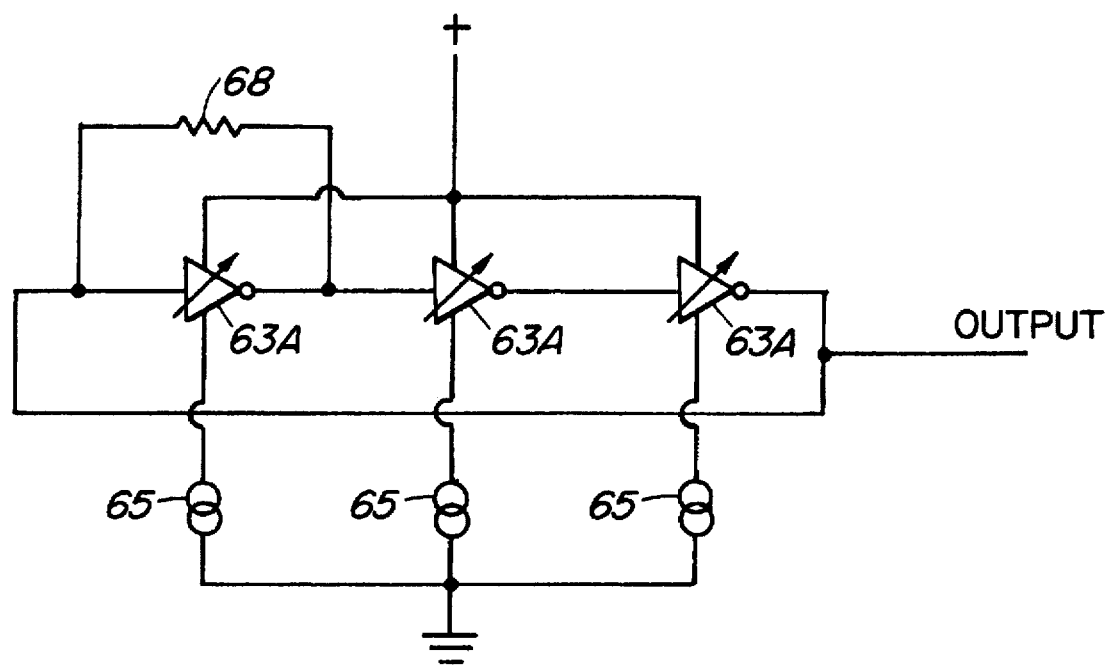
FIG. 6
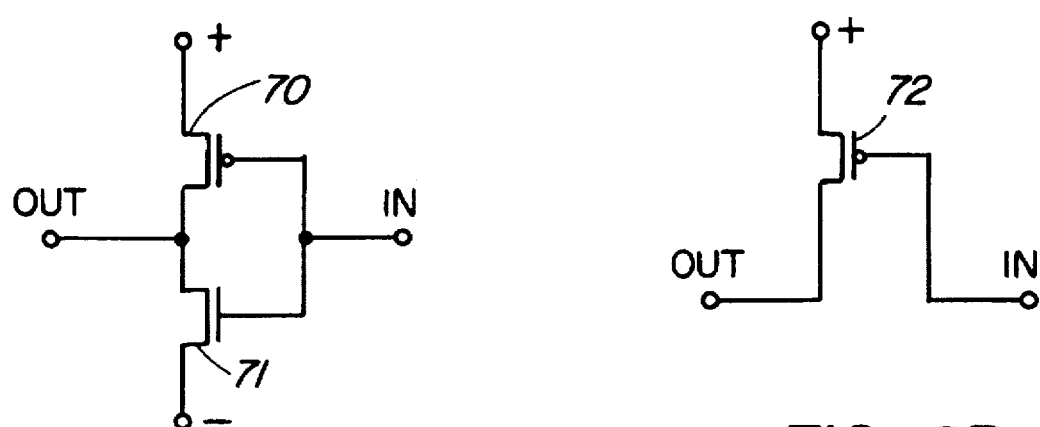
FIG. 6A
FIG. 6B

RING OSCILLATOR HAVING A SUBSTANTIALLY SINUSOIDAL SIGNAL

FIELD OF THE INVENTION

This invention relates to variable oscillators and in particular to an inductorless high frequency ring oscillator that can be used for example in personal communications devices such as digital wireless telephones operating in the gigahertz frequency range.

BACKGROUND TO THE INVENTION

Variable Oscillators have been designed in the past using crystal oscillators, direct analog frequency synthesis, by numerical control, etc. Each form of oscillator has a limitation prohibiting it from being used successfully in the gigahertz range. For example, to form a variable oscillator using crystals, plural crystals are required, but it is difficult or impossible to obtain phase coherence between the high number of crystals that would be required to generate a reasonable number of channels, and frequency accuracy for the large number of channels presents a costly problem.

Digital phase locked loops have been used to provide high frequency variable oscillators, but voltage controlled oscillators in the loops have required bulky off-chip inductors.

It is desirable to be able to form phase locked loops having voltage controlled oscillators which are made completely of complementary symmetry metal oxide (CMOS) field effect transistors (FETs), without the use of off-chip elements such as inductors and capacitors. Due to the widespread industrial capability to manufacture CMOS circuits, mass production of such devices using the CMOS process would provide inexpensive basic tuning devices for such products as wireless telephones that use the gigahertz frequency range.

Various forms of inductorless CMOS based ring oscillators using one or more rings of inverters have been previously designed. For example representative oscillators are described in U.S. Pat. No. 5,331,295 issued Jul. 19, 1994, invented by Jules J. Jelinek et al and in U.S. Pat. No. 5,172,076 issued Dec. 15, 1992, invented by Anthony K. D. Brown.

However, it has been found that ring oscillators using CMOS circuits have significant limitations, for example, decreased amplitude with increasing frequency, and increased phase noise with increasing frequency. It has been recognized that phase noise of a ring oscillator is inversely proportional to the voltage transition slope and the node capacitance value. Thus to decrease phase noise, a larger node capacitance was required, which was required to be provided off-chip. Due to the conflicting requirements which have prohibited reliable operation and reasonable phase-noise at gigahertz frequencies, CMOS ring oscillators have not been used industrially, in favor of ring oscillators using bipolar or GaAs technology.

SUMMARY OF THE INVENTION

The present invention is a ring oscillator that can be used as the voltage controlled oscillator in a phase locked loop, which is formed entirely of CMOS elements. No external capacitors are required, with demonstrated operation up to 1 gigahertz.

It has been discovered that the above result can be achieved by operating the ring oscillator at a frequency which is so close to its maximum operating frequency that substantially no harmonics can pass around the ring, and are cut off. The ring oscillator thus acts as a bandpass filter in which the oscillating frequency is contained, but the harmonic frequencies are excluded. The best results occur when the waveform of the signal passing around the ring is sinusoidal in form.

It has been found that such a ring oscillator can be formed and operate reliably provided that the slopes and voltage swings of the node voltage are equalized. This has been demonstrated with both a single and a double ring structure. The parasitic (typically the gate) capacitance of the CMOS elements provide the required capacitance. In an experimental device the output voltage did not decrease substantially over a substantial frequency variation with otherwise stable conditions.

The ring oscillator should thus be formed by a structure in which the voltage excursions around the operating points of each of the inverters in the ring (or at least one inverter, for a less than ideal design) are equal, and preferably the rising and falling slopes of the signal are equal in magnitude but opposite in sign, thus rendering them similar (but mirror image) in shape.

In accordance with an embodiment of the invention, a ring oscillator is comprised of an odd number of inverters connected in a ring, and apparatus for driving the ring oscillator so that it oscillates at a frequency slightly less than its maximum oscillating frequency such that harmonics of said oscillating frequency are suppressed.

In accordance with another embodiment of the invention, a ring oscillator is formed entirely of CMOS elements comprising a plurality of CMOS inverters formed in a ring, apparatus for controlling current passing through at least a first CMOS inverter in the ring, apparatus for controlling voltage swing of rising and falling edges of a signal passing around the ring to be substantially equal with variation of control current, and apparatus for driving the ring so that it oscillates at a frequency sufficiently close to its maximum oscillation frequency that substantially all harmonics are suppressed.

In accordance with another embodiment, a method of operating a ring oscillator formed of a ring of CMOS inverters is comprised of driving the ring of CMOS inverters such that it oscillates at a frequency such that a signal passing around the ring of CMOS inverters is substantially sinusoidal in form.

BRIEF INTRODUCTION TO THE DRAWINGS

A better understanding of the invention will be obtained by considering the detailed description below, with reference to the following drawings, in which.

Figure 2A:
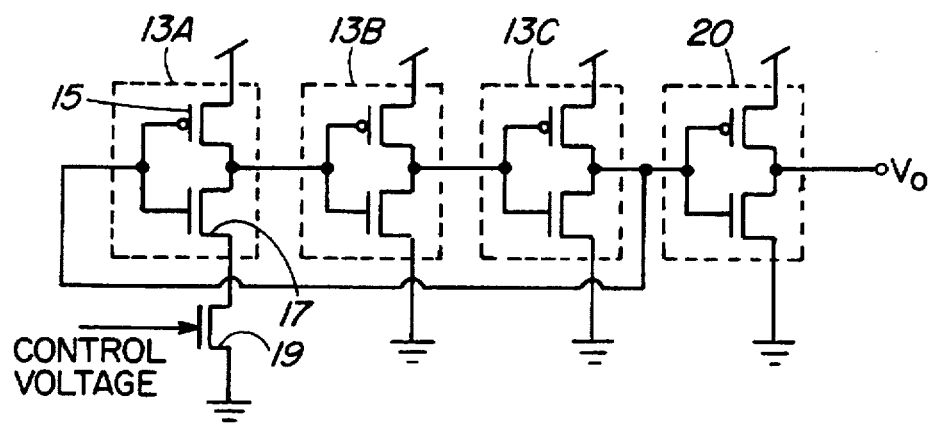
FIG. 2A is a schematic diagram of an embodiment of the invention.
Figure 2B:
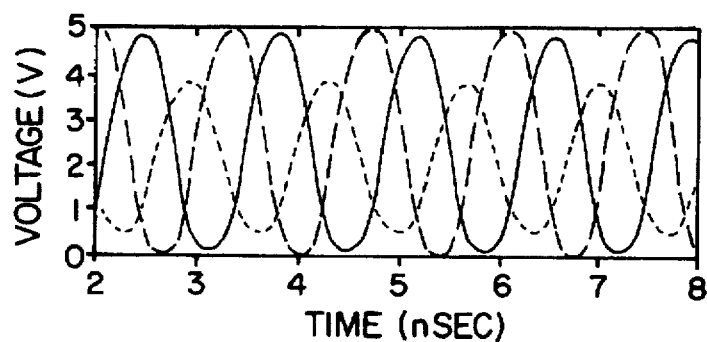
FIG. 2B is a plot of the voltage at various nodes of the embodiment of FIG. 2A.
Figure 2C:
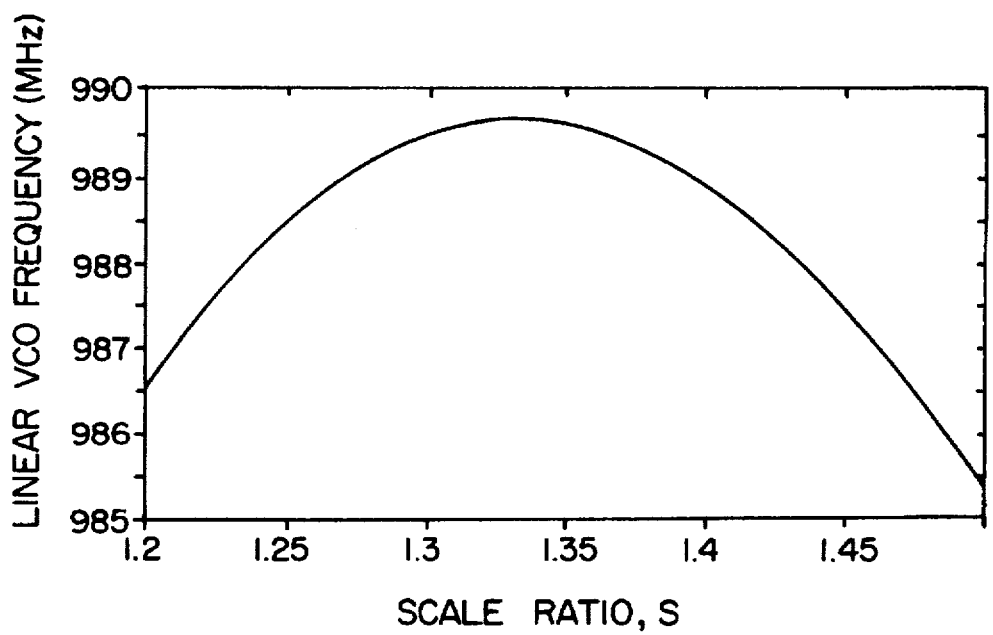
Figure 2D:
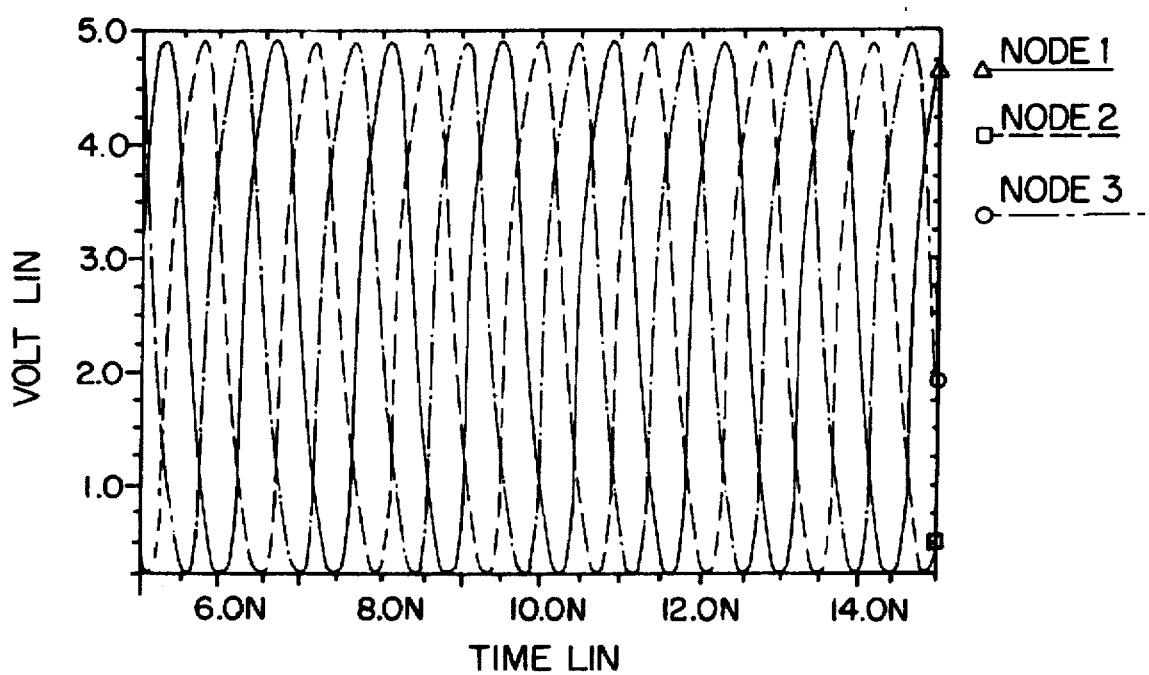
Figure 3A:
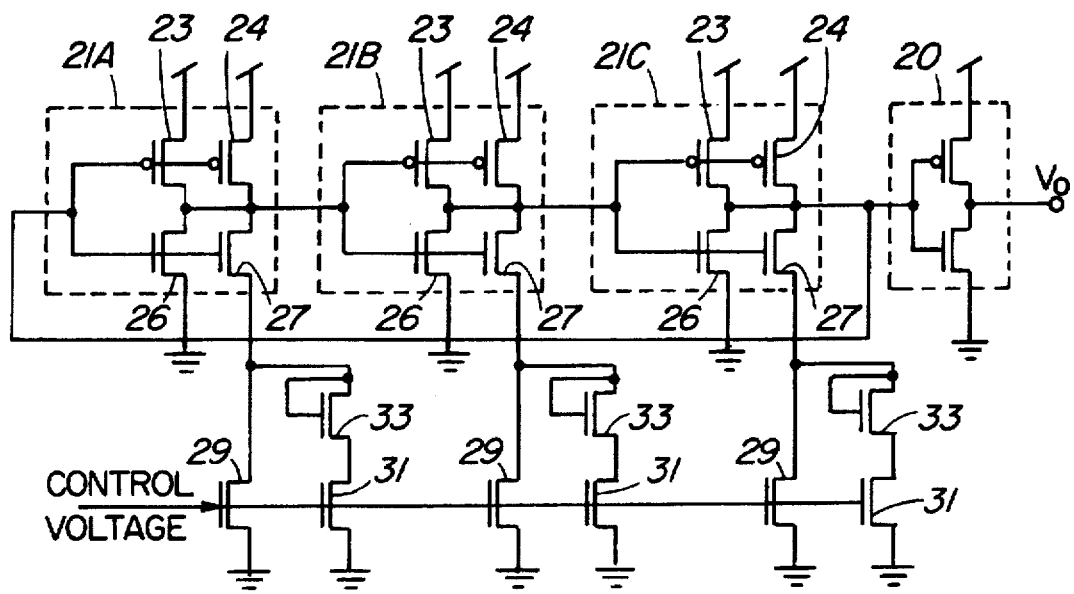
Figure 3B:
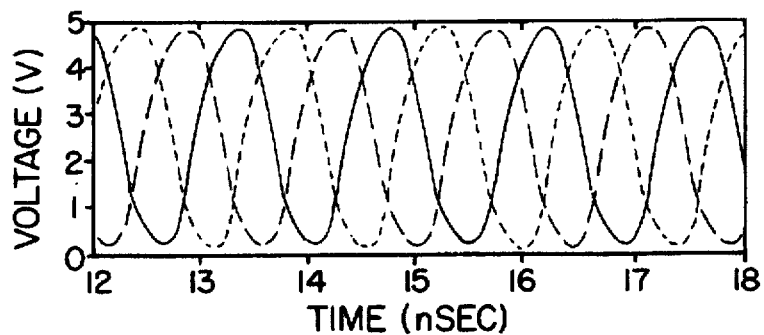
Figure 3C:
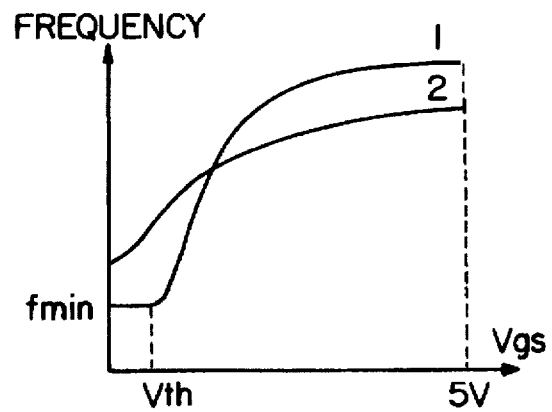
Figure 4A:
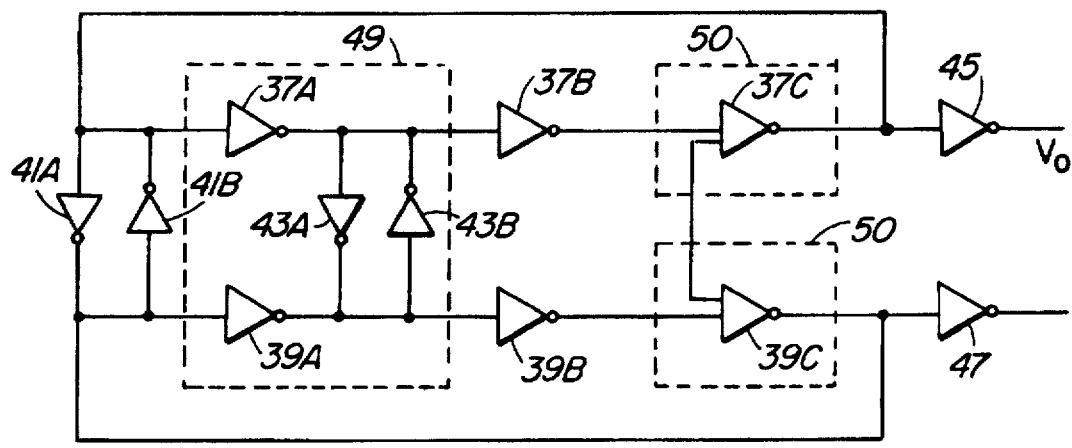

FIG. 2C is a plot of frequency vs scale ratio for the inverter stages of the embodiment of FIG. 2A, FIG. 2D is a plot of the signal shapes at the outputs of each of the inverters of the embodiment of FIG. 2A, with FET size and scale ratios optimized, FIG. 3A is a schematic diagram of another embodiment of the invention, FIG. 3B is a plot of the voltage at various nodes of the embodiment of FIG. 3A, FIG. 3C is a curve of current with control voltage through various FETs of the embodiment of FIG. 3A, FIG. 4A is a block diagram of another embodiment of the invention.

Figure 4B:
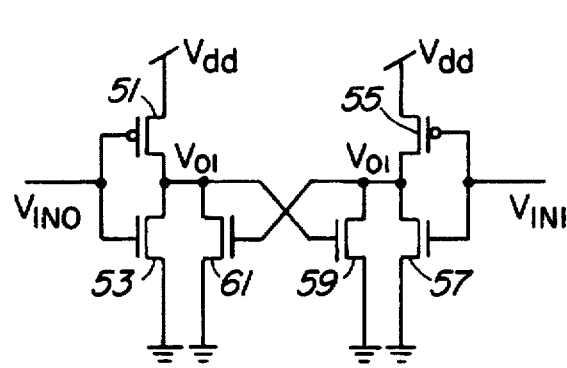
Figure 4C:
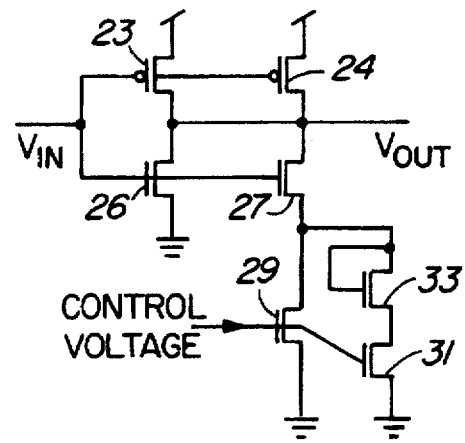

FIGS. 4B and 4C are schematic diagrams of parts of the embodiment of FIG. 4.

Figure 4D:
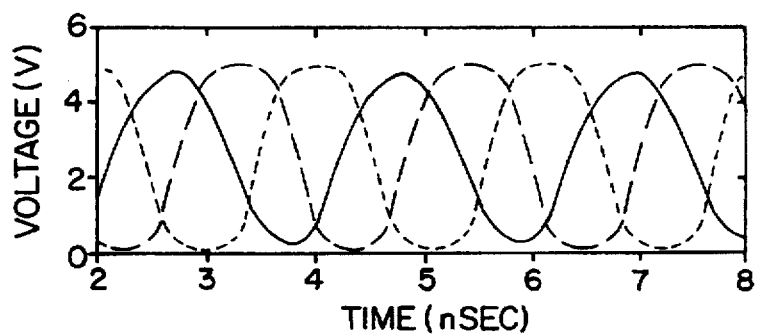

FIG. 4D is a plot of the voltage at various nodes of the embodiment of FIG. 2A.

Figure 5:
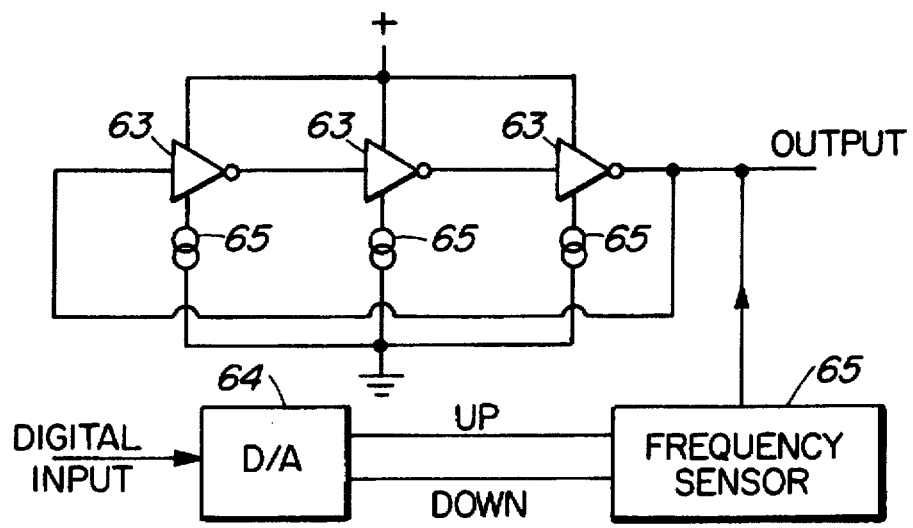
Figure 5A:
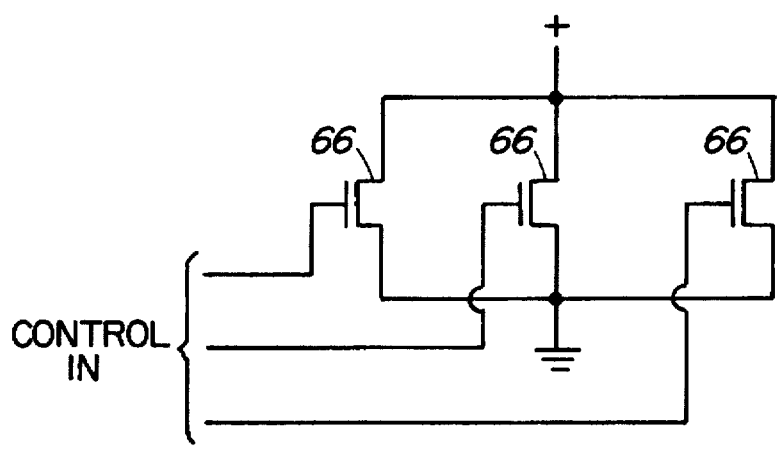

FIGS. 5 and 5A illustrate another embodiment of the invention.

Figure 7:
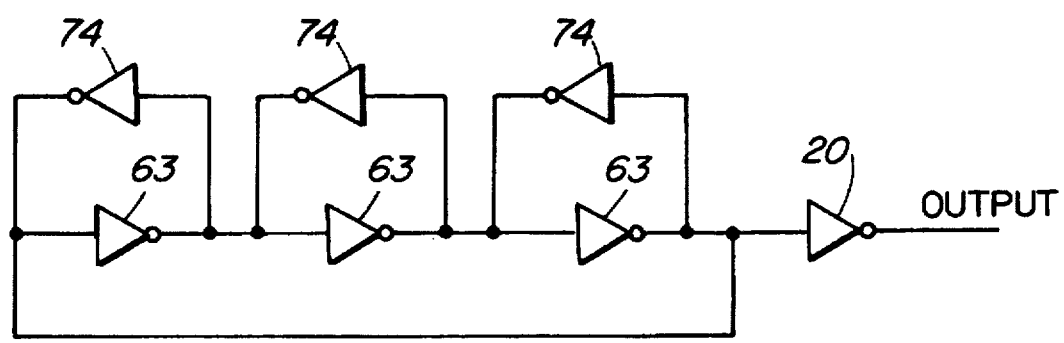

FIGS. 6, 6A and 6B illustrate another embodiment of the invention and variations thereof, and FIG. 7 illustrates another embodiment of the invention.

DETAILED DESCRIPTION OF EMBODIMENTS OF THE INVENTION

Figure 1:
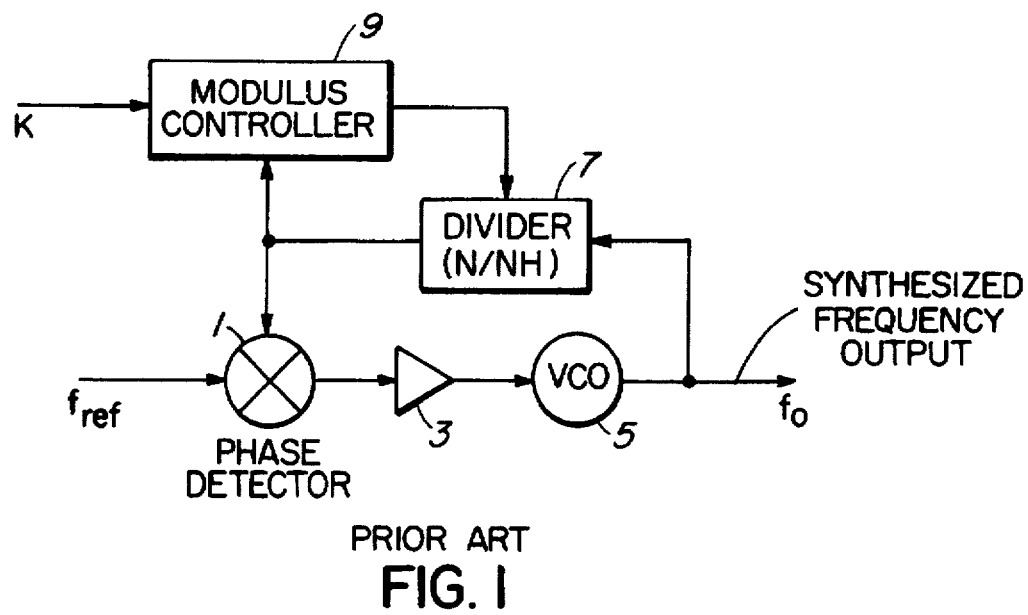
FIG. 1 is a block diagram of a phase locked loop (PLL)

A typical prior art phase locked loop is illustrated in FIG. 1. The loop is comprised of a phase detector 1 receiving an input signal $f_{ref}$, a loop filter 3 for receiving the output signal of the phase detector, a voltage controlled oscillator (VCO) 5 receiving the output signal of the loop filter, and a divider 7 for receiving the output signal of the VCO. The output signal of the divider 7 is applied to another input of the phase detector 1, and to the input of a modulus controller 9. The output of the modulus controller is applied to the divider 7, and the input of the controller 9 receives a signal K.

Operation of the above circuit is well known. The modulus controller receives the digital control signal K and outputs a signal to the divider, providing a value N in divider 7 which is used to divide the output signal of the VCO, i.e. N/N+1. This signal is applied to the phase detector which locks the loop signal to the signal $f_{ref}$. The result is a stable synthesized output signal.

The present invention is directed to design of the VCO, although it will be recognized that the oscillator could as well be used in other applications.

FIG. 2A illustrates a ring oscillator formed entirely of CMOS elements. The oscillator is comprised of a series of CMOS inverters 13A, 13B, 13C, wherein the number of inverters is odd, and is in excess of 2. Preferably the number of inverters is 3, but need not be limited to that number. The output of the last inverter 13C is connected to the input of the first inverter 13A.

In a preferred embodiment of the invention, each of the inverters is comprised of a P-MOS FET 15 which has its source-drain circuit connected in series with the source-drain circuit of an N-MOS FET 17. The gates of FETs 15 and 17 are connected together to form the input to the inverter, and the junction between the FETs forms the output of the inverter. The source of P-MOS FET 15 of each inverter 13A, 13B and 13C is connected to a voltage rail supplying positive voltage, and the source of N-MOS FET 17 of each inverter 13B and 13C except the first inverter 13A is connected to ground.

It should be noted that the FETs of each inverter can be interchanged, if the positive voltage rail and ground are interchanged.

A control FET 19, which is N-MOS type in the embodiment shown, has its source-drain circuit connected in series between the source of FET 17 of the first inverter 13A, and ground. A control voltage is applied to the gate of FET 19.

The output signal of the ring is provided from the junction of the FETs of inverter 13C to the input of an optional buffer formed of a CMOS inverter 20, i.e. to the common gates of its series connected CMOS FETs which are connected between the positive voltage rail and ground. The output signal from the circuit is provided from the junction of the CMOS FETs of the buffer.

The control voltage applied to the gate of FET 19, e.g. derived from $f_{ref}$, the modulus controller and the output signal of the phase detector 1 passing through the loop filter, is a d.c. voltage such as to drive the oscillator at a frequency just under its maximum oscillating frequency, so that harmonics are suppressed.

When the input to inverter 13A is high logic level (high), its output is low, the output of inverter 3B is high, and the output of inverter 13C is low. Thus there is a constant reversal of logic levels at the inputs of each of the inverters. The resulting pulse signal interval is inversely proportional to the propagation delay of the three inverters.

$$1/\text{frequency} = \sum_{i=1}^{3} Td_i,$$

where $Td_i$ is the time delay through one of the inverters. The numeral 6 represents the three delays for the rising edge of each inverter, and three others for the falling edge. Since the delays are proportional to the output capacitance, the maximum frequency is limited by the particular technology used. In the present CMOS technology, the capacitor is the parasitic capacitance of the inverters, which is mainly made up of the gate capacitances of the FETs in the inverters. Due the presence of these parasitic capacitances, no external added capacitor is needed. This allows the size of an integrated circuit which implements the invention to be minimized.

FET 19 provides control of the discharge time of the output capacitor (e.g. mainly the parasitic gate capacitance of inverter 13B and other parasitic capacitances in the circuit), by limiting the current through the NMOS FET 17 and FET 19. When the control voltage, i.e. the gate to source voltage of FET 19 is low, the current is limited by FET 19, operating in the linear mode. When the gate to source voltage of FET 19 is high, e.g. typically around 5 volts, the current becomes limited by N-MOS FET 17.

These two conditions can be used to give an approximation of the propagation delay of the inverter, which is based on the time for change of the output voltage from Vdd (the positive voltage rail voltage) to the switching voltage of the following inverter. In this region, the FET is saturated, to a first order approximation.

This delay is one of six delays of the ring oscillator, but it is the only one which varies with the voltage control. The frequency is generally the inverse of the delay caused by the controlled inverter added to the sum of the delays of the other inverters. The sums of the delays should of course total 360 degrees.

While the above-described circuit provides an operable ring oscillator formed entirely of CMOS elements, the output amplitude at the output nodes of each of the inverters decreases with frequency, as may be seen in FIG. 2B. The solid line represents a lower frequency, the dashed line a higher frequency, and the dotted line represents a highest frequency, of 700 MHz.

As noted earlier, it is an important aspect of the present invention to equalize the waveform excursions on each side of the operating point of each of the inverters. It is also desirable to have the rising and falling slopes of the signals equal, in order to have the signal as close to sinusoidal as possible. It will be recognized that a pure sine wave at the operating frequency will have no harmonics. This can be achieved by controlling the sizes of the NMOS and PMOS FETs forming the CMOS inverters.

The variables used to determine the FET sizes is as follows:

$W_0$ is the width of a first NMOS FET, r is the ratio of the widths of the PMOS and NMOS FETs of each inverter, S is the FET width ratios (the scale) between two consecutive inverters, The factor "2" is used in all sizes due when parallel NMOS and PMOS FETs are used, as in the embodiment described with reference to FIG. 3A.

The FET sizes of the buffer (20) stage can be chosen to be $2 \cdot W_0$ in order to have similar parasitic capacitance values in the buffer as in the first inverter 13A, as seen by the third inverter 13C, and also to simplify the design.

The optimum width of the first FET is the smallest size possible, in order to guarantee minimum power consumption, and maximum frequency due to the existence of the smallest parasitic capacitors. In 1.2 micron CMOS technology for example, the smallest width allowed according to the design rules is 2 micron, which can be used as $W_0$.

The ratio r can be determined by either of two methods. The first method is to provide for the same rise and fall times of the signal passing through the inverter. It has been found that for the 1.2 micron technology the preferred ratio is approximately 2.3. The second method is to design the circuit for an average value of the signal waveform to be 2.5 volts, which is the largest voltage swing possible with a power supply voltage of 5 volts. In this method, the ratios are determined to ensure that the voltage swing on each side of the operating point is equal. In a simulation of the latter method, a ratio of 2.6 resulted.

The ratio S is preferred to be chosen to provide the same propagation delay for each inverter, and the same voltage swing at each node of the oscillator. The propagation delay is proportional to the ratio $W_{n+1}/W_n$ (wherein $W_n$ is the width of the $n^{th}$ inverter and $W_{n+1}$ is the next one). This is a first order approximation neglecting drain capacitors of the inverter. Thus the ratio between the gate width of an inverter and the gate width of the following inverter should be a constant. For the first two inverter stages, this ratio is equal to S, but for the last stage it differs because of the output capacitance which results from the add the gate the gate capacitance of the first buffer and of the gate capacitance of the first stage of the inverter.

To obtain equal interstage propagation delay, it is preferred that the total gate width of the third inverter should be equal to $S^3 \cdot 2 \cdot W_0$. In a prototype design, a real value of $2 \cdot (2 \cdot W_0)$ was chosen, resulting in $S=1.26$.

FIG. 2C is a plot of frequency vs scale ratio S for a design in which the parasitic capacitors of a real circuit are considered. It may be seen that a ratio of $S=1.33$ gives the highest frequency. FIG. 2D, which is a plot of the waveform at each of the nodes (at the outputs of each of the inverters) shows that the waveforms at the three different nodes have the same voltage swing and are symmetrical about a 2.5 volt operating point. It can be compared with FIG. 2B, which shows equal signal excursions on each side of a 2.5 volt operating point, but with decreasing signal amplitudes (instead of constant signal amplitude as in FIG. 2D) in each successive inverter stage due to control only of the current in the first inverter 13A in the circuit of FIG. 2A.

FIG. 3A is a schematic diagram of an embodiment of a CMOS ring oscillator in which the amplitude of the output at each inverter node of a laboratory prototype of the invention did not decrease around the ring, by controlling supply current (and thus the gain) in each of the inverter stages of the oscillator. As may be seen from the graph of FIG. 3B, the amplitude of the output voltage remained substantially constant around the ring.

This embodiment is comprised of a ring of serially connected inverters 21A, 21B and 21C, similar to FIG. 2A. However, in this case each of the inverters is comprised of pairs of FETs connected in parallel, i.e. P-MOS FET 23 connected in parallel with P-MOS FET 24, their sources, drains and gates being connected in parallel. Similarly, N-MOS FETs 26 and 27 are connected in parallel. However, in this case, while the sources of FETs 23 and 24 are both connected to the positive voltage rail (e.g. Vdd), the source of each of the FETs 26 are connected to ground. The scale factor of parallel FETs was noted earlier, with reference to the embodiment of FIG. 2A.

The source of each FET 27, is instead connected to the drain of a control N-MOS FET 29, which has its source connected to ground. Another N-MOS FET 31 has its gate and source connected in parallel with the gate and source of FET 29. The drain of FET 31 is connected to the source-drain circuit of N-MOS FET 33, which is connected in or formed in a diode configuration. FET 33 is connected to the drain of FET 29.

The gates of each of FETs 29 are connected together, and the control voltage is applied to those gates.

In this embodiment, when the gate to source voltage of FET 29 is less than about 1 volt (approximately the threshold voltage), the current through FET 29 is limited by FET 29 and FET 31. FET 33 is always saturated and operates as an active resistance. The current depends on the control voltage (the gate to source voltage, as shown by curve #1 of FIG. 3C). The value Vgs representing the horizontal axis is the control voltage which is the gate to source voltage of FET 29; the vertical axis is the frequency.

When the control voltage (gate to source voltage of FET 29) is intermediate, it is so high that FET 33 (the resistive element) controls the current. The current through FET 33 is constant. In this case only the current through FET 29 is dependent on the control voltage (curve #2 of FIG. 3C)

Finally, with the control voltage very high, e.g. about 5 volts, FET 27 is saturated. The current is independent of the control voltage.

It may be seen that the minimum frequency $f_{min}$ drops the frequency range, but increases the linearity of the circuit. Curve #2 also may be seen to increase the linearity of the circuit.

With the linearity substantially improved in each of the stages, the linearity of the entire circuit is considerably better than that of the circuit of FIG. 2A.

Operation of the above circuit substantially equalizes the slopes of the rising and falling edges of the signal traversing the ring oscillator, and also equalizes the amplitudes from nearly one voltage rail to the other as may be seen from the plot of FIG. 3B, which illustrates the voltage at the output of each of the inverters.

FIG. 4A is a block diagram of another embodiment of the invention. The inverters are shown as elements 37A, 37B and 37C in one ring oscillator, and as elements 39A, 39B and 39C in another ring oscillator. In this case, the inputs of the corresponding inverters 37A and 37B, and 39A and 39B, are crosscoupled via inverters 41A, 41B, and 43A and 43B respectively.

A control voltage is applied to inverters 37C and 39C, which inverters provide an output signal to output buffers 45 and 47 respectively.

A schematic of crosscoupled inverters 49 is shown in FIG. 4B, and a schematic of a controlled delay cell 50 is shown in FIG. 4C. FIG. 4B is representative also of elements 37A, 39A, 43A and 43B, while FIG. 4C is representative also of element 37C.

With reference to FIG. 4B, a CMOS inverter 37A is comprised of PMOS FET 51 and NMOS FET 53 which has its source-drain circuit in series between a voltage rail Vdd and ground. The output of the inverter is at the junction of the drains of FETs 51 and 53. An input signal from the top ring is applied as $V_{IN0}$ to the gates of FETs 51 and 53. Similarly an input signal $V_{IN1}$ from the bottom ring is applied to the gates of PMOS FET 55 and NMOS FET 57 which form inverter 39A, the source-drain circuits of which are connected between Vdd and ground. The outputs of the inverters are taken from the junctions of the CMOS FETs, at/$V_{O1}$ and $V_{O1}$.

The junction of FETs 51 and 53 is connected to the gate of an NMOS FET 59, and the junction of FETs 55 and 57 is connected to the gate of an NMOS FET 61. The source-drain circuit of FET 59 is connected between the junction of FETs 55 and 57 and ground, and the source-drain circuit of FET 61 is connected between the junction of FETs 51 and 53 and ground.

FETs 59 and 61 clearly crosscouple and invert the output signals from inverters 37A and 39A, and the equivalent circuit crosscouples the output signals from inverters 37C and 39C, which output signals are applied to the following inverters.

With reference to FIG. 4C, this circuit is identical to any of the control circuits described earlier with respect to FIG. 3A, and has been labeled with reference numerals similar to one of the control circuits. The circuit is duplicated for control of inverter 37C. However, the same frequency control voltage is applied to the gates of FETs 29 and 31 for both controlling inverters 37C and 39C.

Crosscoupling of the two rings phase locks them, and reduces the effect of power supply noise. This improvement is achieved however at the price of a decreased maximum oscillating frequency, due to increased node capacitance. The node capacitance increases as a result of the added cross-coupling FETs.

FIG. 4D illustrates constant amplitude of the signal at each of the oscillator nodes, but the maximum frequency and the maximum amplitude illustrated is not as high as the maximum achieved with the embodiment of FIG. 3A.

The power consumption of all three embodiments, in laboratory prototypes, increased as a linear function of oscillating frequency.

FIG. 5 is a diagram of another embodiment of the invention. Plural inverters 63 are connected in a ring oscillator formation. An up/down data pulse source 64 provides a control signal to a frequency sensor 65, which applies a control voltage to the output node of inverter 63 that is dependent on the frequency and polarity of the up/down pulses. The power supplied to each inverter from the positive (+) to the negative (ground) voltage rails is controlled, by means of current controllers 65. The current controllers are connected in series with the current path to the power terminals of the inverters (i.e. to the sources of the PMOS and NMOS FETs of the CMOS inverters).

This circuit is the generalized form of the circuit of FIG. 2A, and operates in a similar manner, except that instead of an FET 19 controlling current applied to inverter 13A as in FIG. 2A, corresponding FETs control current applied to each of the inverters 63.

FIG. 5A illustrates plural current controlling NMOS FETs 66, which have their source-drain circuits connected in parallel between ground and a voltage rail (source terminal) of a corresponding inverter 63. By applying control voltages to each of the gates of FETs 66, each FET 66 can be switched into operation, allowing more and more current to pass to the corresponding inverter. By restricting the current, the inverters become current starved, and the frequency of the loop becomes higher and higher. Control of the frequency of the loop, and in particular its Q is thereby made possible.

The structure can be made single ended as described, or differential.

FIG. 6 illustrates another embodiment of the invention. In this embodiment, the gain of any of the inverters is made variable, as indicated by reference numeral 63A indicating a variation of the gain of inverters 63. The gains of the inverter can be made variable by using analog inverters. In that case, a feedback resistance element 68 is connected between the output of an inverter and its input.

The feedback element for a CMOS inverter can be as shown in FIG. 6A, which is a CMOS inverter formed of PMOS and NMOS FETS 70 and 71 respectively having their source-drain circuits connected in series between voltage rails, and their gates connected together. By adjusting the voltages on the drains of FETs 70 and 71, the FETs 70 and 71 become more or less current starved, changing the effective resistance that they represent in the feedback path of the CMOS inverter.

A feedback path for a CMOS inverter can alternatively be provided by means of a single FET 72, shown as a PMOS FET in FIG. 6B. The gate of the FET 72, shown as IN, is connected to the output of an inverter such as 63A, and the drain of the FET is connected to the input to the inverter. The source of the FET is connected to a voltage rail +. By adjusting the voltage + applied to the drain of FET 72, its effective resistance changes, varying the gain of the inverter.

It should also be noted that by choosing the PMOS transistor width ratios during the design process, the harmonic content at each of the nodes at the outputs of the inverters is controlled to be minimized, to achieve balance between operating point, and to have the rising and falling edge signal slopes mirror images of each other (i.e. to achieve as close to sinusoidal form as possible).

FIG. 7 illustrates another embodiment of the invention, in which each of the inverters 63 in a ring has another inverter 74 connected in parallel with it, in reverse direction. In this manner, the gain of each of the inverters can be controlled, in a manner analogous to the embodiments of FIGS. 6, 6A and 6B, to more closely achieve the result described above, i.e. as close to sinusoidal waveform as possible. Each of the inverters in the ring provides a phase shift of 120 degrees.

A person understanding this invention may now conceive of alternative structures and embodiments or variations of the above. All those which fall within the scope of the claims appended hereto are considered to be part of the present invention.

We claim:

1. A ring oscillator comprising an odd number of inverters connected in a ring, and means for driving the ring oscillator so that it oscillates at a frequency slightly less than its maximum oscillating frequency such that harmonics of said oscillating frequency are suppressed, means for balancing waveforms of a signal passing around the ring of inverters whereby positive and negative excursions thereof are substantially identical, in which the inverters are comprised of a pair of CMOS FETs, said FETs having a predetermined width ratio therebetween whereby said balancing is achieved.

2. A ring oscillator as defined in claim 1 in which said balancing means is comprised of means for controlling current in at least one of said inverters.

3. A ring oscillator as defined in claim 1 in which said balancing means is comprised of means for controlling the gain of at least one of said inverters.

4. A ring oscillator as defined in claim 1 including means for controlling slopes of rising and falling edges of said signal passing around the ring of inverters to be substantially mirror images of each other.

5. A ring oscillator as defined in claim 1 in which said signal passing around the ring of inverters is substantially sinusoidal in shape.

6. A ring oscillator as defined in claim 1 in which said ratio is between about 2.3 and about 2.6, and in which a ratio scale between successive inverter stages is about 1.26.

7. A ring oscillator as defined in claim 1 formed entirely of CMOS elements, comprising a plurality of CMOS inverters formed in a ring, means for controlling current passing through at least a first CMOS inverter in the ring, means for controlling voltage swing of rising and falling edges of a signal passing around the ring to be substantially equal about an operating point with variation of control current.

8. A ring oscillator as defined in claim 7 in which each of the CMOS inverters is comprised of a source-drain circuit of a PMOS FET connected in series with a source-drain circuit of an NMOS FET, the source of each PMOS FET being connected to a positive voltage rail, the means for controlling current being comprised of NMOS FETs having their source-drain circuits in series with a current supply to the inverters.

9. A ring oscillator as defined in claim 7, including means for controlling slopes of rising and falling edges of a signal passing around the ring to be substantially equal in magnitude and opposite in sign, with variation of control current.

10. A ring oscillator as defined in claim 9 in which said means for controlling current and said means for controlling slopes are comprised of plural control circuits, each control circuit being comprised of a pair of FETs having sources and gates connected in parallel, the sources being connected to a voltage rail and the gates being connected to a source of control voltage, the drain of one of the pair of FETs being connected via an FET configured as a diode to the drain of the other of the pair of FETs, means for connecting the drain of the other of the pair of FETs of respective control circuits to the source of an FET of a corresponding CMOS inverter.

11. A ring oscillator as defined in claim 10 in which said voltage rail is ground.

12. A ring oscillator as defined in claim 10 including a CMOS buffer connected between an output of the ring oscillator and an output conductor.

13. A ring oscillator as defined in claim 11 in which each of the CMOS inverters is comprised of a source-drain circuit of a PMOS FET connected in series with a source-drain circuit of an NMOS FET, the source of each PMOS FET being connected to a positive voltage rail, the FETs of the control circuits being comprised of NMOS FETs, the source of each NMOS FET being connected to the drain of an NMOS FET of a corresponding control circuit.

14. A ring oscillator as defined in claim 10 in which the number of CMOS inverters is three.

15. A ring oscillator comprising an odd number of inverters connected in a ring, and means for driving the ring oscillator so that it oscillates at a frequency sligthly less than its maximum oscillating frequency such that harmonics of said oscillating frequency are suppressed, said ring oscillator being formed entirely of CMOS elements, said ring being formed of more than two inverters connected in series, an output of the series of inverters being connected to an input of the series of inverters, each inverter being comprised of a PMOS field effect transistor having its source-drain circuit in series with an NMOS FET, means for connecting a source of each of the PMOS FETs to a voltage rail and the source of each of the NMOS FETs other than a first NMOS FET in the series of inverters to ground, the source of the first NMOS FET being connected via a source-drain circuit of a control NMOS FET to ground, and means for applying a control voltage to a gate of the control NMOS FET.

16. A ring oscillator as defined in claim 15 further comprising an output buffer formed of a CMOS inverter having an input connected to the output of the series of inverters, for providing an output signal at a junction of a PMOS and NMOS FET of the output buffer.

17. A pair of ring oscillators each as defined in claim 15, further including means for cross-coupling the outputs of an even number of corresponding pairs of CMOS inverters of each ring, and means for obtaining respective output signals from the outputs of each of the series of inverters.

18. A pair of ring oscillators as defined in claim 17, further comprising a pair of buffers having their inputs connected to the outputs of respective ones of the series of inverters.

19. A ring oscillator comprising an odd number of inverters connected in a ring, and means for driving the ring oscillator so that it oscillates at a frequency slightly less than its maximum oscillating frequency such that harmonics of such oscillating frequency are suppressed, said ring oscillator being formed entirely of CMOS elements, comprising two rings of similar numbers of CMOS inverters, each ring having an odd number of CMOS inverters in excess of two, means connecting an output of each ring to an input of the same ring, means for cross-coupling the outputs of an even number of corresponding ones of the inverters of each ring via cross-coupling inverters, and means for controlling current flow via a control voltage in a last CMOS inverter of each ring feeding an output terminal.

20. A ring oscillator as defined in claim 19 in which the means for controlling current flow is comprised of a pair of FETs having sources and gates connected in parallel, the sources being connected to a voltage rail and the gates being connected to a source of control voltage, the drain of one of the pair of FETs being connected via an FET configured as a diode to the drain of the other of the pair of FETs, and means for connecting the drain of the other of the pair of FETs to the sources of the last CMOS inverters.

21. A ring oscillator as defined in claim 19 in which the means for controlling current flow is comprised of a pair of control circuits, each control circuit being comprised of a pair of FETs having sources and gates connected in parallel, the sources being connected to a voltage rail and the gates being connected to a source of control voltage, the drain of one of the pair of FETs being connected via an FET configured as a diode to the drain of the other of the pair of FETs, means for connecting the drain of the other of the pair of FETs of respective control circuits to the source of an FET of a corresponding last CMOS inverter in the ring feeding an output terminal.

22. A ring oscillator as defined in claim 21 further comprising a pair of buffers having their inputs connected to the outputs of respective ones of said last CMOS inverters.

23. A ring oscillator as defined in claim 20 in which the number of CMOS inverters in each ring is three.

* * * * *